(12) United States Patent
Kiyama et al.

(10) Patent No.: US 10,443,151 B2
(45) Date of Patent: *Oct. 15, 2019

(54) GALLIUM NITRIDE SUBSTRATE

(71) Applicant: Sumitomo Electric Industries, Ltd., Osaka-shi, Osaka (JP)

(72) Inventors: Makoto Kiyama, Itami (JP); Ryu Hirota, Itami (JP); Seiji Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/958,589

(22) Filed: Apr. 20, 2018

(65) Prior Publication Data

US 2018/0237946 A1 Aug. 23, 2018

Related U.S. Application Data

(63) Continuation of application No. 15/318,029, filed as application No. PCT/JP2015/061675 on Apr. 16, 2015, now Pat. No. 10,006,147.

(30) Foreign Application Priority Data

Jul. 24, 2014 (JP) .................................. 2014-150846

(51) Int. Cl.
*B32B 3/00* (2006.01)
*C30B 29/40* (2006.01)
(Continued)

(52) U.S. Cl.
CPC ............ *C30B 29/406* (2013.01); *C30B 25/04* (2013.01); *C30B 25/165* (2013.01);
(Continued)

(58) Field of Classification Search
CPC ..... C30B 25/04; C30B 25/165; C30B 25/183; H01L 21/02395; H01L 21/0254;
(Continued)

(56) References Cited

U.S. PATENT DOCUMENTS

2002/0014681 A1 2/2002 Tsuda et al.
2003/0080345 A1 5/2003 Motoki et al.
(Continued)

FOREIGN PATENT DOCUMENTS

CN 101024903 A 8/2007
CN 103367137 A 10/2013
(Continued)

OTHER PUBLICATIONS

Kensaku Motoki, "Development of GaN Substrates" SEI technical review, vol. 175, Jul. 2009, pp. 10-18.

*Primary Examiner* — Elizabeth E Mulvaney
(74) *Attorney, Agent, or Firm* — Drinker Biddle & Reath LLP

(57) ABSTRACT

There is provided a gallium nitride substrate having a C plane as a surface with a diameter of not less than 100 mm, the gallium nitride substrate including first regions and second regions having different average values of band-edge emission intensities in a micro photoluminescence mapping at 25° C. in a square region located in the C plane and having sides each having a length of 2 mm, an average value Ibe1a of the band-edge emission intensities of the first regions and an average value Ibe2a of the band-edge emission intensities of the second regions satisfying the following relational expressions (I) and (II): Ibe1a>Ibe2a . . . (I) and 2.1≤Ibe1a/Ibe2a≤9.4 . . . (II).

9 Claims, 6 Drawing Sheets

(51) Int. Cl.
*H01L 29/04* (2006.01)
*H01L 29/20* (2006.01)
*H01L 21/02* (2006.01)
*C30B 25/04* (2006.01)
*C30B 25/16* (2006.01)
*C30B 25/18* (2006.01)
*H01L 29/66* (2006.01)
*H01L 29/872* (2006.01)

(52) U.S. Cl.
CPC ........ *C30B 25/183* (2013.01); *H01L 21/0254* (2013.01); *H01L 21/0262* (2013.01); *H01L 21/02395* (2013.01); *H01L 21/02639* (2013.01); *H01L 29/04* (2013.01); *H01L 29/2003* (2013.01); *H01L 29/66212* (2013.01); *H01L 29/872* (2013.01)

(58) Field of Classification Search
CPC ........... H01L 21/0262; H01L 21/02639; H01L 29/04; H01L 29/2003
See application file for complete search history.

(56) References Cited

U.S. PATENT DOCUMENTS

| | | |
|---|---|---|
| 2007/0117356 A1 | 5/2007 | Shin et al. |
| 2011/0232564 A1 | 9/2011 | Takeyama |
| 2013/0065010 A1 | 3/2013 | Hayashi et al. |
| 2013/0260538 A1 | 10/2013 | Fujikura |

FOREIGN PATENT DOCUMENTS

| | | |
|---|---|---|
| JP | 2003-347590 A | 12/2003 |
| JP | 2006-066496 A | 3/2006 |
| JP | 2007-137763 A | 6/2007 |
| JP | 2010-199598 A | 9/2010 |
| JP | 2013-010681 A | 1/2013 |
| JP | 2013-060346 A | 4/2013 |
| JP | 2014-112695 A | 6/2014 |

FIG.7
(a)
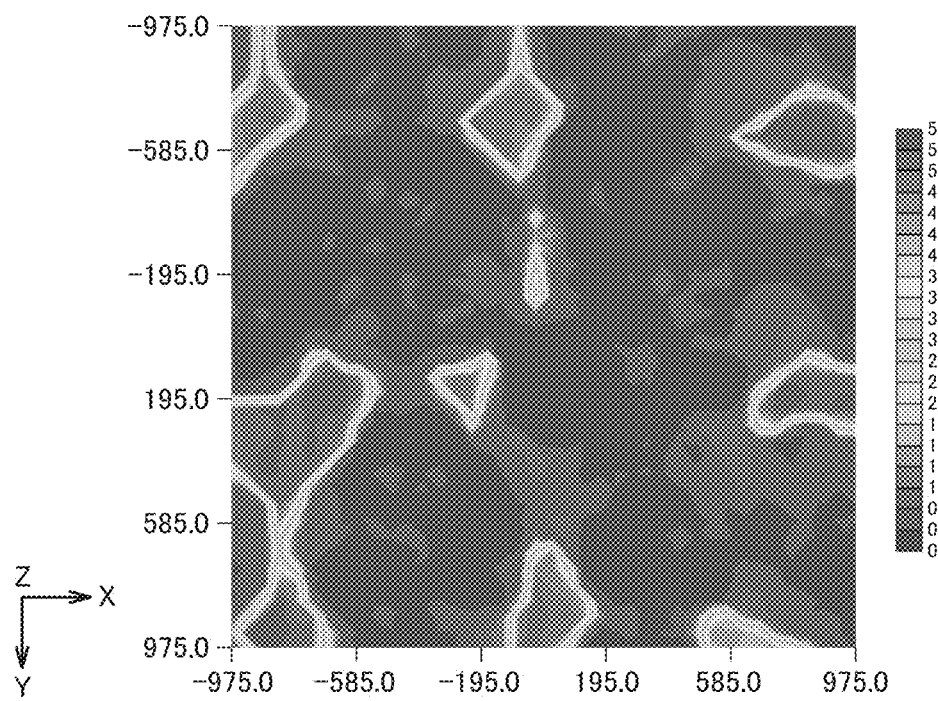
(b)
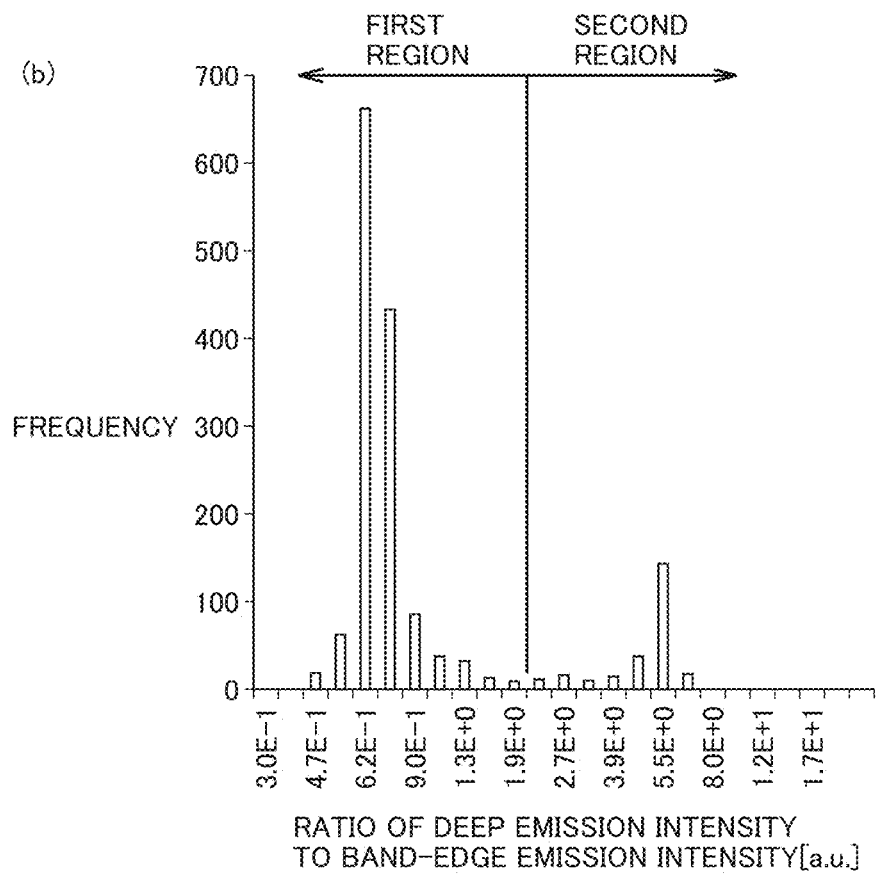

GALLIUM NITRIDE SUBSTRATE

This is a continuation application of copending application Ser. No. 15/318,029, having a § 371 date of Dec. 12, 2016, which is a national stage filing based on PCT International Application No. PCT/JP2015/061675, filed on Apr. 16, 2015. The copending application Ser. No. 15/318,079 is incorporated by reference herein in its entirety.

TECHNICAL FIELD

The present invention relates to a gallium nitride (GaN) substrate.

BACKGROUND ART

Among nitride semiconductor substrates, GaN substrates have been drawing attention as substrates for manufacturing semiconductor devices such as a light emitting device and an electronic device. However, at present, for manufacturing of a GaN substrate, growth has to be performed on a heterogeneous substrate. Since lattice constant and thermal expansion coefficient are different between the heterogeneous substrate and the GaN crystal, a multiplicity of crystal defects are generated in the GaN crystal, disadvantageously.

To address this, for example, Non-Patent Document 1 discloses a GaN substrate, wherein a GaN crystal provided with a multiplicity of dot-shaped depressions in its surface is grown such that crystal defects are located intensively at the centers of the depressions in the GdN crystal and crystal defects are reduced around the depressions.

CITATION LIST

Non Patent Document

NPD 1: Kensaku Motoki, "Development of GaN Substrates", SEI technical review, Vol. 175, July, 2009, pp. 10-18

SUMMARY OF INVENTION

Technical Problem

However, when a semiconductor device such as a Schottky barrier diode (SBD) is produced using the above GaN substrate, characteristics of the semiconductor device may be decreased. Hence, improvement has been required.

Solution to Problem

A GaN substrate according to one embodiment of the present invention is a GaN substrate having a C plane as a surface with a diameter of not less than 100 mm, the GaN substrate including first regions and second regions having different average values of band-edge emission intensities in micro photoluminescence (PL) mapping (micro-PL mapping) at 25° C. in a square region located in the C plane and having sides each having a length of 2 mm, an average value Ibe1a of the band-edge emission intensities of the first regions and an average value Ibe2a of the band-edge emission intensities of the second regions satisfying the following relational expressions (I) and (II):

$$Ibe1a > Ibe2a \quad \text{(I) and}$$

$$2.1 \leq Ibe1a/Ibe2a \leq 9.4 \quad \text{(II)}.$$

A bonded substrate according to one embodiment of the present invention is a bonded substrate in which the GaN substrate is bonded to a supporting substrate.

Advantageous Effects of Invention

According to the description above, the characteristics of the semiconductor device produced using the GaN substrate can be suppressed from being decreased.

BRIEF DESCRIPTION OF DRAWINGS

Each of FIG. 3(a) to FIG. 3(d) is a schematic cross sectional view illustrating an exemplary method for manufacturing the GaN substrate of the first embodiment.

FIG. 7(a) is a micro-PL mapping diagram showing a distribution of ratios of the deep emission intensities to the band-edge emission intensities in the C plane of the GaN substrate of sample 2 as obtained by the micro-PL mapping measurement for the GaN substrate of sample 2, and FIG. 7(b) is a histogram of the ratios of the deep emission intensities to the band-edge emission intensities as obtained from the micro-PL mapping diagram of FIG. 7(a).

DESCRIPTION OF EMBODIMENTS

Figure 1:
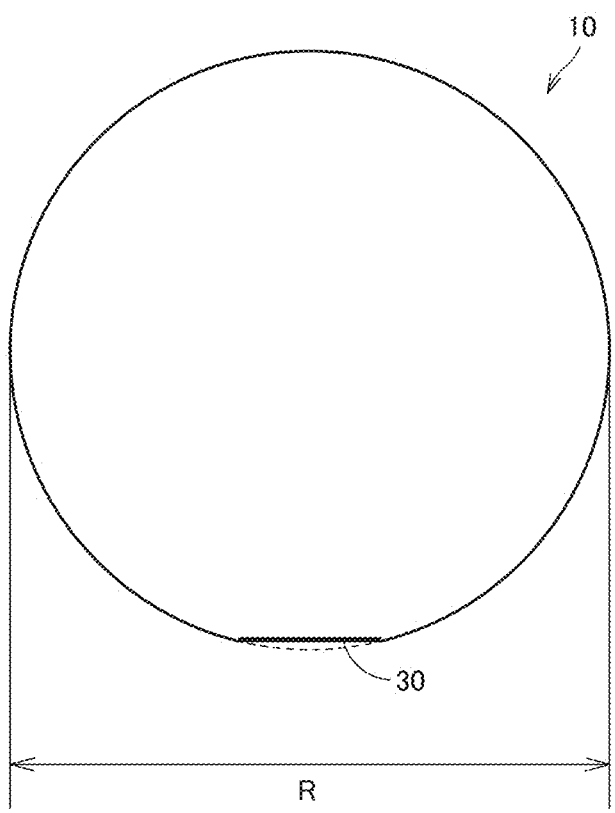
FIG. 1 is a schematic plan view of a surface (C plane) of a GaN substrate of a first embodiment.

Description of Embodiments of the Present Invention

First, embodiments of the present invention are listed and described.

(1) A GaN substrate according to one embodiment of the present invention is a GaN substrate having a C plane as a surface with a diameter of not less than 100 mm, the GaN substrate including first regions and second regions having different average values of band-edge emission intensities in micro-PL mapping at 25° C. in a square region located in the C plane and having sides each having a length of 2 mm, an average value Ibe1a of the band-edge emission intensities of the first regions and an average value Ibe2a of the band-edge emission intensities of the second regions satisfying the following relational expressions (I) and (II):

$$Ibe1a > Ibe2a \quad \text{(I) and}$$

$$2.1 \leq Ibe1a/Ibe2a \leq 9.4 \quad \text{(II)}.$$

With such a configuration, characteristics of a semiconductor device produced using the GaN substrate can be suppressed from being decreased.

(2) Preferably in the GaN substrate according to one embodiment of the present invention, a ratio (Ideep/Ibe)1a of the average value of the deep emission intensities of the first regions to the average value of the band-edge emission intensities of the first regions in the micro-PL mapping satisfies a relational expression (III) of (Ideep/Ibe)1a≤ 0.47 . . . (III), and a ratio (Ideep/Ibe)2a of the average value of the deep emission intensities of the second regions to the average value of the band-edge emission intensities of the second regions in the micro-PL mapping satisfies a relational expression (IV) of (Ideep/Ibe)2a≤3 . . . (IV). In this case, there can be provided a more improved effect of suppressing the decrease of the characteristics of the semiconductor device produced using the GaN substrate.

(3) Preferably in the GaN substrate according to one embodiment of the present invention, a ratio (Ideep/Ibe)1a of the average value of the deep emission intensities of the first regions to the average value of the band-edge emission intensities of the first regions in the micro-PL mapping satisfies a relational expression (V) of (Ideep/Ibe)1a≤ 0.11 . . . (V), and a ratio (Ideep/Ibe)2a of the average value of the deep emission intensities of the second regions to the average value of the band-edge emission intensities of the second regions in the micro-PL mapping satisfies a relational expression (VI) of (Ideep/Ibe)2a≤1 . . . (VI). In this case, there can be provided a further improved effect of suppressing the decrease of the characteristics of the semiconductor device produced using the GaN substrate.

(4) Preferably in the GaN substrate according to one embodiment of the present invention, each of the first regions has an oxygen concentration of not less than $5 \times 10^{17}$ cm$^{-3}$, and each of the second regions has an oxygen concentration of less than $5 \times 10^{17}$ cm$^{-3}$. In this case, there can be provided a more improved effect of suppressing decrease of the characteristics of the semiconductor device formed through epitaxial growth or the like of another semiconductor layer on the surface of the GaN substrate.

(5) Preferably in the GaN substrate according to one embodiment of the present invention, each of the first regions has a threading dislocation density of not less than $1 \times 10^6$ cm$^{-2}$. In this case, there can be provided a more improved effect of suppressing decrease of the characteristics of the semiconductor device formed through epitaxial growth or the like of another semiconductor layer on the surface of the GaN substrate.

(6) A bonded substrate according to one embodiment of the present invention is a bonded substrate in which the GaN substrates described above is bonded to a supporting substrate. With such a configuration, characteristics of a semiconductor device produced using the bonded substrate can be suppressed from being decreased.

Details of Embodiments of the Present Invention

The following describes embodiments. It should be noted that the same reference characters indicate the same or equivalent portions in the figures used for description of the embodiments.

First Embodiment

<GaN Substrate>

FIG. 1 shows a schematic plan view of a surface (C plane) of a GaN substrate of a first embodiment. As shown in FIG. 1, GaN substrate 10 of the first embodiment has a surface with a substantially circular shape although it has an orientation flat 30. GaN substrate 10 has a diameter R of not less than 100 mm.

Figure 2:
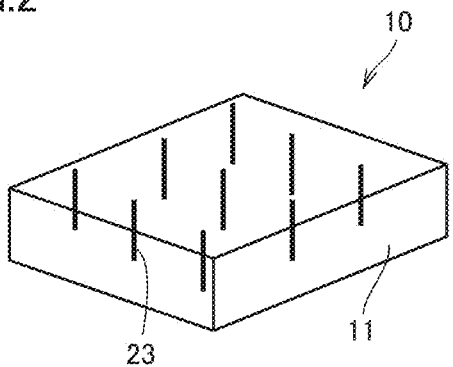
FIG. 2 is a schematic perspective view of a portion of a surface of a GaN substrate of a first embodiment.

FIG. 2 shows a schematic perspective view of a portion of the surface of the GaN substrate of the first embodiment. GaN substrate 10 of the first embodiment is composed of a GaN crystal 11. Regions having threading dislocations 23 intensively located therein are formed to extend from the surface of GaN crystal 11 toward inside of GaN crystal 11.

<Method for Manufacturing GaN Substrate>

Figure 3:
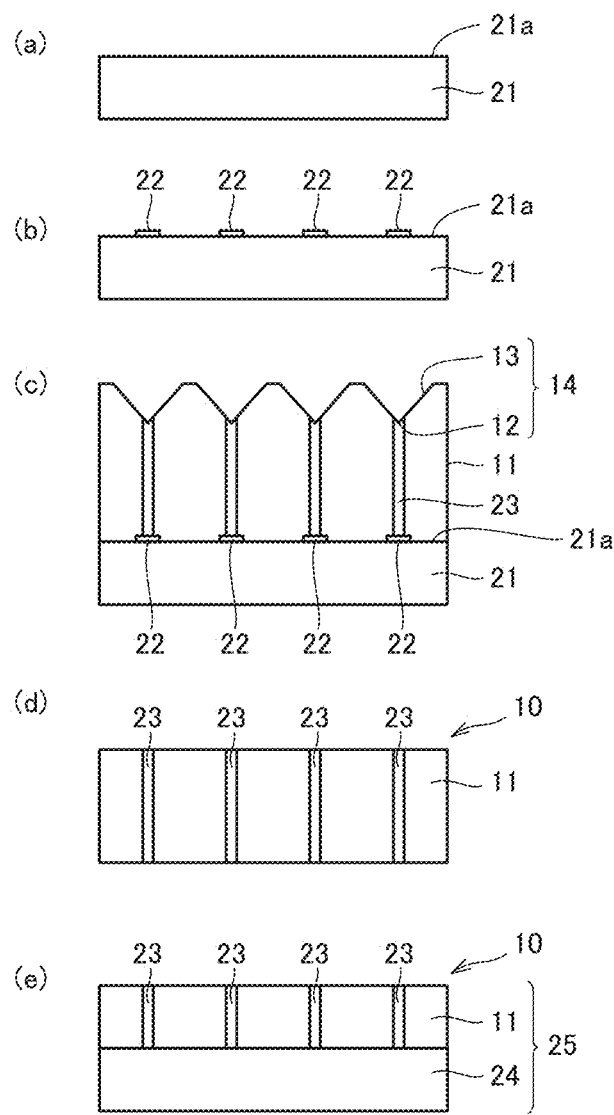
FIG. 3(e) is a schematic cross sectional view of an exemplary bonded substrate of the first embodiment.

With reference to schematic cross sectional views of FIG. 3(a) to FIG. 3(d), the following describes an exemplary method for manufacturing the GaN substrate of the first embodiment. First, as shown in FIG. 3(a), a growth substrate 21 is prepared which has a surface 21a to serve as a growth surface. Growth substrate 21 is not particularly limited as long as GaN crystal 11 can be grown on surface 21a. Examples of growth substrate 21 may include: a heterogeneous substrate such as gallium arsenide (GaAs); and a homogeneous substrate composed of GaN.

Next, as shown in FIG. 3(b), a patterning layer 22 is formed on a surface 21a of growth substrate 21. Patterning layer 22 can be formed by: forming a silicon oxide (SiO$_2$) film through plasma CVD (Chemical Vapor Deposition) on the entire surface 21a of growth substrate 21; forming a resist patterned through photolithography on the SiO$_2$ film; and performing etching using the resist as an etching mask, for example.

Next, as shown in FIG. 3(c), GaN crystal 11 is grown on surface 21a of growth substrate 21 having patterning layer 22 formed thereon. GaN crystal 11 can be grown through HVPE (Hydride Vapor Phase Epitaxy) in which metallic Ga is used as a gallium (Ga) source material and ammonia (NH$_3$) gas is used as a nitrogen (N) source material, for example.

Next, as shown in FIG. 3(d), growth substrate 21 on the backside of GaN crystal 11 is removed by grinding or the like, for example. Then, for example, the surface of GaN crystal 11 is planarized by grinding or the like, and then is polished, thus obtaining GaN substrate 10 of the first embodiment.

Moreover, for example, as shown in a schematic cross sectional view of FIG. 3(e), a heterogeneous substrate 24 can be bonded onto the surface of the obtained GaN substrate 10 of the first embodiment from which growth substrate 21 has been removed, thereby producing a bonded substrate 25. Examples of heterogeneous substrate 24 can include a sapphire substrate, an AlN substrate, a SiC substrate, a GaAs substrate, a ZrB$_2$ substrate, a SiO$_2$/Al$_2$O$_3$ sintered compact substrate, a Mo substrate, and the like.

Moreover, the method for bonding GaN substrate 10 of the first embodiment to heterogeneous substrate 24 is not particularly limited; however, it is preferable to use a surface activation method or a fusion bonding method in order to bond them together uniformly at a low temperature, for example. Here, the surface activation method refers to a method for bonding them together after exposing the bonding surface of GaN substrate 10 to plasma to activate the bonding surface, whereas the fusion bonding method refers to a method for bonding them together by heating respective washed surfaces (bonding surfaces) under a pressure. Moreover, GaN substrate 10 of the first embodiment can be bonded to heterogeneous substrate 24 with a joining film interposed therebetween.

<Band-Edge Emission Intensity and Deep Emission Intensity>

Figure 4:
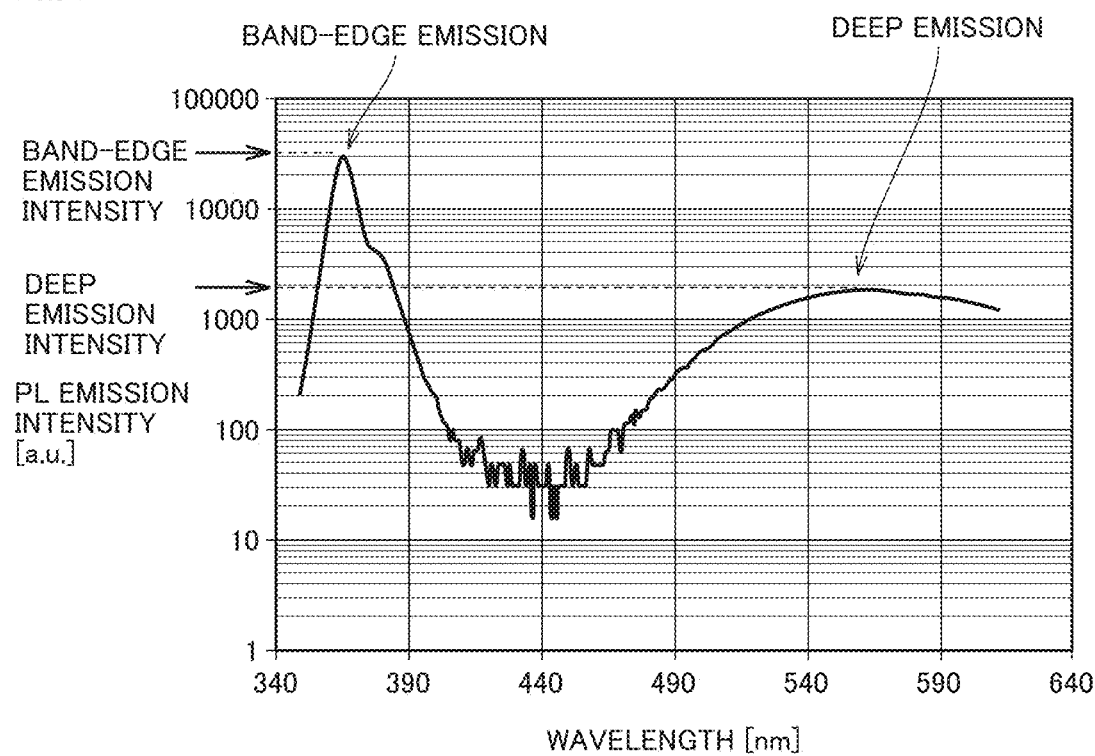
FIG. 4 shows an exemplary PL emission spectrum obtained at 25° C. at one point of a square region located within the C plane of the GaN substrate of the first embodiment and having sides each having a length of 2 mm.

FIG. 4 shows an exemplary PL emission spectrum obtained by performing micro-PL mapping at 25° C. at one point of a square region (hereinafter, referred to as "2 mm☐ region") located within the C plane of GaN substrate 10 of the first embodiment and having sides each having a length of 2 mm. The horizontal axis of FIG. 4 represents a wavelength [nm] of the PL emission and the vertical axis represents intensity [a.u.] of the PL emission.

In the PL emission spectrum shown in FIG. 4, a band-edge emission having a peak in a wavelength of about 365 nm and a deep emission having a peak in a wavelength falling within the range of 450 nm to 600 nm are observed.

Here, in the present specification, the largest one of PL emission intensities at peaks corresponding to the band-edge emission is defined as "band-edge emission intensity", whereas the largest one of PL emission intensities at peaks corresponding to the deep emission is defined as "deep emission intensity".

Then, the above-described micro-PL mapping at 25° C. is performed for a plurality of locations in an arbitrary 2 mm☐ region within the C plane of GaN substrate 10 of the first embodiment, thereby specifying band-edge emission intensities and deep emission intensities in the respective measurement locations for the micro-PL mapping in the above-described manner.

Then, the 2 mm☐ region is divided into first regions and second regions. Each of the first regions represents a region located in the 2 mm☐ region and having a band-edge emission intensity equal to or more than ½ of the maximum band-edge emission intensity among the band-edge emission intensities specified as described above. Each of the second regions represents a region located in the 2 mm☐ region and having a band-edge emission intensity less than ½ of the maximum band-edge emission intensity.

Then, an average value of the band-edge emission intensities of the plurality of first regions specified as described above is calculated, thereby determining an "average value (Ibe1a) of the band-edge emission intensities of the first regions".

Moreover, an average value of the band-edge emission intensities of the plurality of second regions specified as described above is calculated, thereby determining an "average value (Ibe2a) of the band-edge emission intensities of the second regions".

<Relational Expressions>

In GaN substrate 10 of the first embodiment, the average value (Ibe1a) of the band-edge emission intensities of the first regions and the average value (Ibe2a) of the band-edge emission intensities of the second regions satisfy the following relational expressions (I) and (II):

$$Ibe1a > Ibe2a \quad (I)$$

$$2.1 \leq Ibe1a/Ibe2a \leq 9.4 \quad (II)$$

<Function and Effect>

In GaN substrate 10 of the first embodiment, the average value (Ibe1a) of the band-edge emission intensities of the first regions and the average value (Ibe2a) of the band-edge emission intensities of the second regions satisfy the above relational expressions (I) and (II). Hence, it is possible to suppress decrease of characteristics of a semiconductor device formed through epitaxial growth or the like of another semiconductor layer on the surface of GaN substrate 10 of the first embodiment. This is what was found by the present inventors as a result of diligent study. Details thereof will be described later.

<Preferable Configuration of First Embodiment>

An average value of the deep emission intensities of the plurality of first regions specified as described above is calculated, thereby determining an "average value (Ideep1a) of the deep emission intensities of the first regions".

Further, an average value of the deep emission intensities of the plurality of second regions specified as described above is calculated, thereby determining an "average value (Ideep2a) of the deep emission intensities of the second regions".

Preferably, a ratio ((Ideep/Ibe)1a) of the average value (Ideep1a) of the deep emission intensities of the first regions to the average value (Ibe1a) of the band-edge emission intensities of the first regions satisfies a below-described relational expression (III), and a ratio of the average value (Ideep2a) of the deep emission intensities of the second regions to the average value (Ibe2a) of the band-edge emission intensities of the second regions satisfies a below-described relational expression (IV). In this case, there can be provided an improved effect of suppressing the decrease of the characteristics of the semiconductor device formed through epitaxial growth or the like of another semiconductor layer on the surface of GaN substrate 10 of the first embodiment.

$$(Ideep/Ibe)1a \leq 0.47 \quad (III)$$

$$(Ideep/Ibe)2a \leq 3 \quad (IV)$$

Moreover, in order to further improve the effect of suppressing the decrease of the characteristics of the semiconductor device, (Ideep/Ibe)1a more preferably satisfies the following relational expression (V) and (Ideep/Ibe)2a more preferably satisfies the following relational expression (VI):

$$(Ideep/Ibe)1a \leq 0.11 \quad (V)$$

$$(Ideep/Ibe)2a \leq 1 \quad (VI)$$

Second Embodiment

A feature of a GaN substrate 10 of a second embodiment lies in that each of the first regions has an oxygen concentration of not less than $5 \times 10^{17}$ cm$^{-3}$ and each of the second regions has an oxygen concentration of less than $5 \times 10^{17}$ cm$^{-3}$. Also in this case, there can be provided an improved effect of suppressing decrease of characteristics of a semiconductor device formed through epitaxial growth or the like of another semiconductor layer on the surface of GaN substrate 10 of the second embodiment.

The second embodiment is the same as the first embodiment apart from the above description, and therefore repeated description thereof will not be provided. In other words, GaN substrate 10 of the second embodiment also includes the feature of GaN substrate 10 of the first embodiment, in addition to the above-described feature that GaN substrate 10 of the second embodiment includes the first regions each having an oxygen concentration of not less than $5 \times 10^{17}$ cm$^{-3}$ and the second regions each having an oxygen concentration of less than $5 \times 10^{17}$ cm$^{-3}$.

Third Embodiment

A feature of a GaN substrate 10 of a third embodiment lies in that each of the first regions has a threading dislocation density of not less than $1\times10^6$ cm$^{-2}$. In GaN substrate 10 of the third embodiment, dislocations are intensively located in the first regions each having a threading dislocation density of not less than $1\times10^6$ cm$^{-2}$, thereby improving crystallinity of the second region having a threading dislocation density of less than $1\times10^6$ cm$^{-2}$.

The square region having sides each having a length of 2 mm on the surface of GaN substrate 10 includes the first regions each having a threading dislocation density of not less than $1\times10^6$ cm$^{-2}$ and the second regions each having a threading dislocation density of less than $1\times10^6$ cm$^{-2}$ as in the third embodiment presumably because the following phenomena (i) to (v) occur in this order in the course of the crystal growth of GaN crystal 11 from FIG. 3(b) to FIG. 3(c).

(i) Threading dislocations are reduced in facets 13 of each depression 14 in the surface of GaN crystal 11 because the dislocations are moved to a boundary between adjacent facets 13.

(ii) A defect surface (surface defect portion) is formed because the dislocations are gathered below the boundary between adjacent facets 13 of depression 14 in the surface of GaN crystal 11.

(iii) The dislocations are prevented from being expanded by merging and confinement of the dislocations at multiple points at which the plurality of facets 13 of depressions 14 in the surface of GaN crystal 11 cross with one another.

(iv) Line defect portions and core portions 12 above the line defect portions are formed due to the dislocations gathering below the multiple points.

(v) The low defect portions are increased in facets 13 due to growth of facets 13.

The third embodiment is the same as the first embodiment and the second embodiment apart from the above descriptions, and therefore repeated description thereof will not be provided. In other words, GaN substrate 10 of the third embodiment not only includes the first regions each having a threading dislocation density of not less than $1\times10^6$ cm$^{-2}$ and the second regions each having a threading dislocation density of less than $1\times10^6$ cm$^{-2}$, but also includes the feature of GaN substrate 10 of the first or second embodiment.

It should be noted that the threading dislocations are dislocations threading in the growth direction, and the threading dislocation density can be evaluated by counting a density of etch pits resulting from selective etching. Examples of the selective etching method include: immersion of the GaN substrate in a heated acid or alkaline aqueous solution, immersion of the GaN substrate in a molten salt of potassium hydroxide (molten KOH); or the like. Moreover, the threading dislocation density can be also measured using cathode luminescence (CL). In the CL, portions with threading dislocations are shown as dark points. Hence, the number of the dark points is counted to determine a density per unit area (1 cm$^2$), thereby measuring the threading dislocation density.

EXAMPLES

<Production of GaN Substrate of Sample 1>

First, as shown in FIG. 3(a), as growth substrate 21, a GaAs substrate was prepared which had a surface (((111) A plane) 21a having a diameter of 110 mm.

Next, as shown in FIG. 3(b), a silicon oxide (SiO$_2$) film having a thickness of 0.1 μm was formed on the surface of the GaAs substrate through plasma CVD (Chemical Vapor Deposition). Then, photolithography and etching employing BHF (buffered hydrofluoric acid) were employed to form a patterning layer 22 constituted of a SiO$_2$ film. Patterning layer 22 had such a shape that circles each having a diameter of 50 μm were arranged at a pitch of 800 μm in the form of a lattice, and directions of the lattice were coincided with m-axis and a-axis directions Next, as shown in FIG. 3(c), a low-temperature buffer layer was grown on the GaAs substrate serving as growth substrate 21 and having patterning layer 22 formed thereon. Then, GaN crystal 11 was grown for 10 hours to have a thickness of about 1200 μm. GaN crystal 11 was grown through HVPE using metallic Ga as a Ga source material and using NH$_3$ gas as a N source material.

The growth of GaN crystal 11 through HVPE (Hydride Vapor Phase Epitaxy) was performed as follows. First, a GaAs substrate serving as growth substrate 21 was placed on a sample holder made of quartz in a hot wall type reactor. Next, while using H$_2$ gas as a carrier gas, gallium chloride (GaCl) gas (partial pressure: 3.06 kPa) and NH$_3$ gas (partial pressure: 6.12 kPa) were supplied for 10 hours to the GaN template substrate heated to cause its center to have a temperature of 1000° C. The gallium chloride (GaCl) gas (partial pressure: 3.06 kPa) had been generated by spraying hydrogen chloride (HCl) gas to metallic Ga (heated at 800° C.) placed in an upstream-side boat with hydrogen (H$_2$) gas being used as a carrier gas. In this way, GaN crystal 11 having a thickness of about 1200 μm was grown.

The low-temperature buffer layer was formed to have a thickness of about 50 nm before the growth of GaN crystal 11 by supplying, for 30 minutes, GaCl gas (partial pressure: 1.5 kPa) and NH$_3$ gas (partial pressure: 4.2 kPa) to the GaAs substrate heated at 500° C. The GaCl gas (partial pressure: 1.5 kPa) was generated by spraying HCl gas to the metallic Ga placed in the upstream-side boat with H$_2$ gas being used as carrier gas.

Next, the backside surface of GaN crystal 11 grown as described above was ground to remove the GaAs substrate. Next, the surface of GaN crystal 11 was planarized through grinding and was then polished, thereby producing a GaN substrate of sample 1 (with a finishing thickness of 500 μm), which was a freestanding GaN substrate having a circular shape with a diameter of 100 mm, having the C plane as a surface, and having a facet structure.

<Production of GaN Substrate of Sample 2>

In the same manner as in sample 1 except that an amount of oxygen in the atmosphere in the crystal growth furnace was controlled during the growth of the GaN crystal, a GaN substrate of a sample 2 was produced (with a finishing thickness of 500 μm), which was a freestanding GaN substrate that had a circular shape with a diameter of 100 mm, that had the C plane as a surface, and that had a facet structure.

Here, the amount of oxygen was controlled such that the amount of oxygen in the atmosphere of the crystal growth furnace became not more than 100 ppm at an early stage of the growth of the GaN crystal, particularly, 10 minutes after starting the crystal growth.

Specifically, before starting the growth of the GaN crystal, gases such as N$_2$, H$_2$ and Ar (argon) were supplied for not less than 10 minutes at a room temperature to replace the atmosphere in the crystal growth furnace and an oxygen concentration in the crystal growth furnace was monitored with an oxygen concentration detector such that the oxygen concentration becomes not more than 100 ppm. Also after starting the growth of the GaN crystal, measurement and control were performed to set the oxygen concentration in the crystal growth furnace at not more than 100 ppm.

<Micro-PL Mapping Measurement for GaN Substrate of Sample 2>

Figure 5:
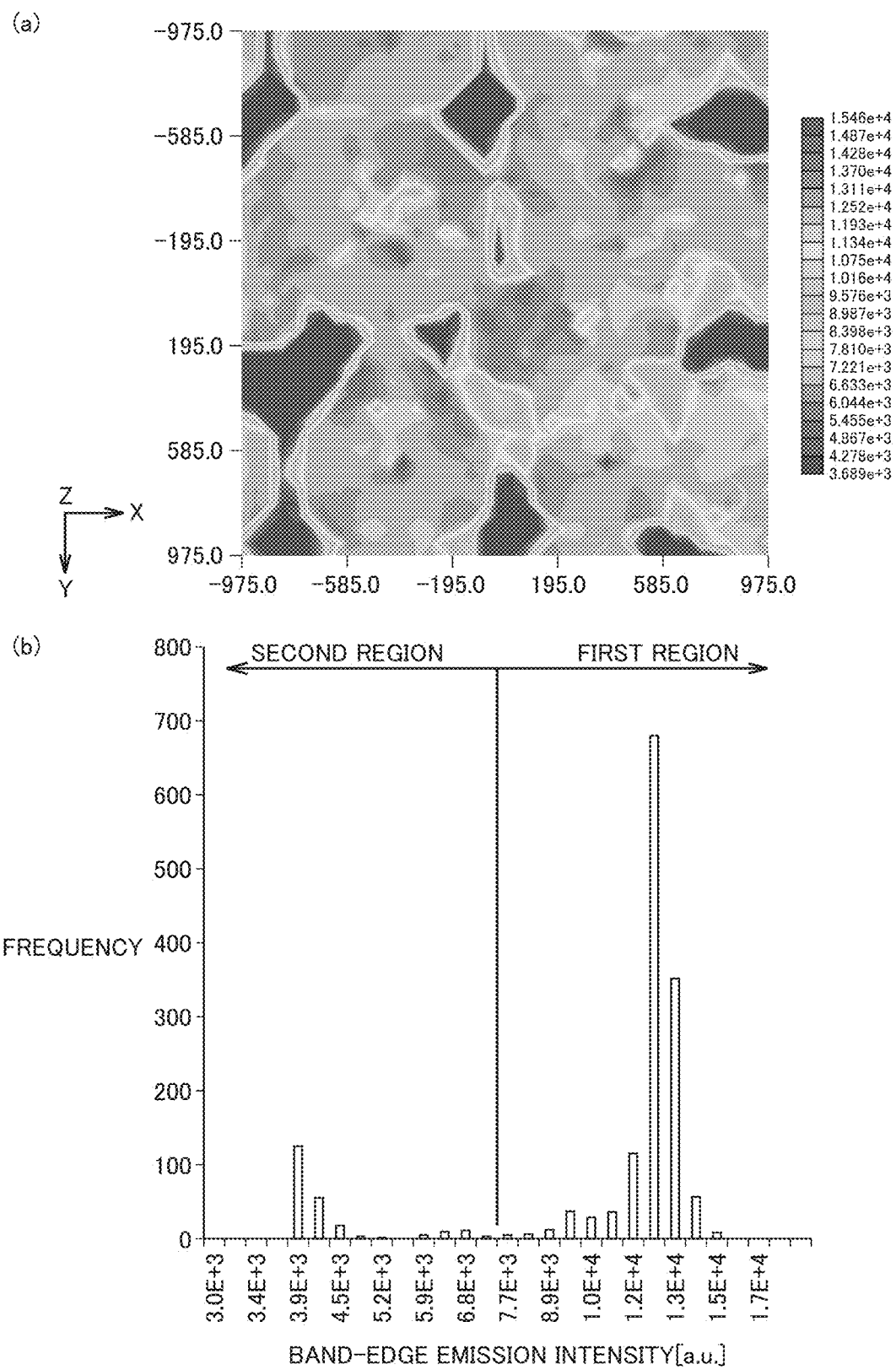
FIG. 5(a) is a micro-PL mapping diagram showing a distribution of band-edge emission intensities in a C plane of a GaN substrate of a sample 2 as obtained by micro-PL mapping measurement for the GaN substrate of sample 2.
FIG. 5(b) is a histogram of the band-edge emission intensities as obtained from the micro-PL mapping diagram of FIG. 5(a).
Figure 6:
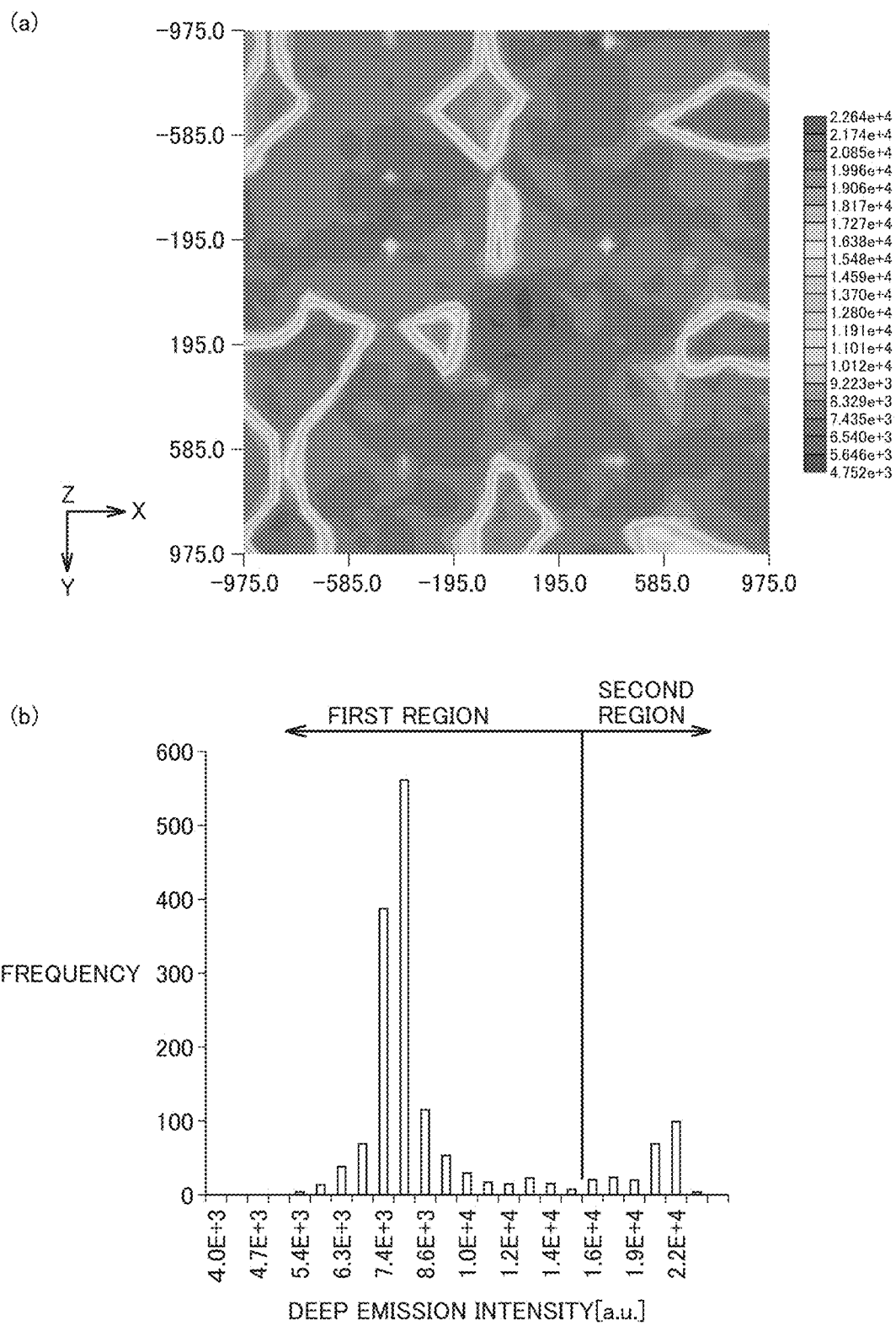
FIG. 6(a) is a micro-PL mapping diagram showing a distribution of deep emission intensities in the C plane of the GaN substrate of sample 2 as obtained by the micro-PL mapping measurement for the GaN substrate of sample 2.
FIG. 6(b) is a histogram of the deep emission intensities as obtained from the micro-PL mapping diagram of FIG. 6(a).

Micro-PL mapping measurement was performed onto the C plane, which was the surface of the GaN substrate of sample 2 produced as described above. Results thereof are shown in FIG. 5 and FIG. 6. It should be noted that the micro-PL mapping measurement is such a method that PL emission spectral analysis at 25° C. is performed for a plurality of locations in a 2 mm☐ region within the C plane of the GaN substrate and a distribution of band-edge emission intensities or deep emission intensities in the 2 mm☐ region is indicated by way of mapping.

Here, each micro-PL mapping measurement for the plurality of locations in the 2 mm☐ region was performed under the following conditions:

Irradiated light: second harmonic wave of argon-ion laser light (wavelength of 244 nm);

Irradiation energy density: 0.3 mW/circular spot with a diameter of 10 μm;

PL emission wavelength region: 350 nm to 610 nm;

Measurement regions: 40 points×40 points at an interval of 50 μm in the 2 mm☐ region at the central portion of the C plane serving as the surface of the GaN substrate; and Temperature: room temperature (25° C.).

It should be noted that FIG. 5(a) is a micro-PL mapping diagram showing a distribution of the band-edge emission intensities in the C plane of the GaN substrate of sample 2 as obtained by the micro-PL mapping measurement for the GaN substrate of sample 2. FIG. 5(b) is a histogram of the band-edge emission intensities as obtained from the micro-PL mapping diagram of FIG. 5(a).

Classification in FIG. 5(b) is such that the first regions represent regions having band-edge emission intensities equal to or more than ½ of the maximum band-edge emission intensity among the band-edge emission intensities obtained from the micro-PL mapping diagram, and the second regions represent regions having band-edge emission intensities less than ½ of the maximum band-edge emission intensity.

Meanwhile, FIG. 6(a) is a micro-PL mapping diagram showing a distribution of the deep emission intensities in the C plane of the GaN substrate of sample 2 as obtained by the micro-PL mapping measurement for the GaN substrate of sample 2. FIG. 6(b) is a histogram of the deep emission intensities as obtained from the micro-PL mapping diagram of FIG. 6(a).

Also in FIG. 6(b), classification of the first and second regions is made based on the classification in FIG. 5(b). Since the band-edge emission intensity and the deep emission intensity are in a negative correlation relation (the deep emission intensity becomes small at a location having a large band-edge emission intensity and the deep emission intensity becomes large at a location having a small band-edge emission intensity), the classification of the first and second regions can be clearly made also based on the magnitudes of deep emission intensities as shown in FIG. 6(b) as with the classification of the first and second regions made based on the magnitudes of band-edge emission intensities.

Moreover, FIG. 7(a) is a micro-PL mapping diagram showing a distribution of the ratios of the deep emission intensities to the band-edge emission intensities in the C plane of the GaN substrate of sample 2 as obtained by the micro-PL mapping measurement for the GaN substrate of sample 2. FIG. 7(b) is a histogram of the ratios of the deep emission intensities to the band-edge emission intensities in the C plane of the GaN substrate as obtained from the micro-PL mapping diagram of FIG. 7(a).

Moreover, classification in FIG. 7(b) is also made based on the classification of the first and second regions in FIG. 5(b). Since the band-edge emission intensity and the deep emission intensity are in the negative correlation as described above, the classification of the first and second regions can be clearly made also based on the ratios of the deep emission intensities to the band-edge emission intensities as shown in FIG. 7(b) as with the classification of the first and second regions made based on the magnitudes of band-edge emission intensities.

<Production of GaN Substrate of Sample 3>

In the same manner as in sample 2 except that the temperature of the center of the GaAs substrate during the growth of GaN crystal 11 was set at 1030° C., a GaN substrate of a sample 3 was produced (with a finishing thickness of 500 μm), which was a freestanding GaN substrate that had a circular shape with a diameter of 100 mm, that had the C plane as a surface, and that had a facet structure.

<Production of GaN Substrate of Sample 4>

In the same manner as in sample 2 except that the temperature of the center of the GaAs substrate during the growth of GaN crystal 11 was set at 980° C., a GaN substrate of a sample 4 was produced (with a finishing thickness of 500 μm), which was a freestanding GaN substrate that had a circular shape with a diameter of 100 mm, that had the C plane as a surface, and that had a facet structure.

<Production of GaN Substrate of Sample 5>

As growth substrate 21, a GaN substrate having a surface (C plane) with a diameter of 110 mm was produced with the same method and under the same conditions as those for the GaN substrate of sample 3. In the same manner as in sample 2 except that the temperature of the center of the GaN substrate during the growth of GaN crystal 11 was set at 1000° C., no low-temperature GaN buffer layer was formed, the partial pressure of the GaCl gas was set at 3.06 kPa, and the partial pressure of the $NH_3$ gas was set at 6.12 kPa, a GaN substrate of a sample 5 was produced (with a finishing thickness of 500 μm) on the foregoing GaN substrate. The GaN substrate of sample 5 was a freestanding GaN substrate that had a circular shape with a diameter of 100 mm, that had the C plane as a surface, and that had a facet structure.

<Production of GaN Substrate of Sample 6>

In the same manner as in sample 5 except that the temperature of the center of the GaN substrate during the growth of GaN crystal 11 was set at 1030° C., a GaN substrate of a sample 6 was produced (with a finishing thickness of 500 μm), which was a freestanding GaN substrate that had a circular shape with a diameter of 100 mm, that had the C plane as a surface, and that had a facet structure.

<Production of GaN Substrate of Sample 7>

In the same manner as in sample 5 except that the temperature of the center of the GaN substrate during the growth of GaN crystal 11 was set at 980° C., a GaN substrate of a sample 7 was produced (with a finishing thickness of 500 μm), which was a freestanding GaN substrate that had a circular shape with a diameter of 100 mm, that had the C plane as a surface, and that had a facet structure.

<Production of GaN Substrate of Sample 8>

As the growth substrate, a GaN template substrate was prepared. The GaN template substrate was prepared by forming a GaN film with a thickness of 2 μm through MOCVD (Metal Organic Chemical Vapor Deposition) on the surface (C plane) of the sapphire substrate having a diameter of 110 mm. Then, without forming patterning layer 22 constituted of a $SiO_2$ film and the low-temperature buffer layer, the GaN template substrate is supplied with GaCl gas (partial pressure: 2.40 kPa) and $NH_3$ gas (partial pressure: 2.40 kPa) together with $N_2$ gas serving as a carrier gas while heating to attain a temperature of 1100° C. at the center of the GaN template substrate to grow GaN crystal 11 to have a mirror surface, thereby growing GaN crystal 11 having a thickness of about 1 mm while performing silicon (Si) doping using silane ($SiH_4$) gas. In the same manner as in sample 1, a GaN substrate (Si concentration: $2\times10^{18}$ $cm^{-3}$) of sample 10 was produced (with a finishing thickness of 500 μm), which was a freestanding GaN substrate that had a circular shape having a diameter of 100 mm, that had the C plane as a surface, and that had a coreless structure (structure having no depressions constituted of core portions and facets).

<Evaluation on Threading Dislocation Density>

The threading dislocation density of a GaN substrate produced in the same manner as in sample 2 was evaluated by way of etch pits. A solution of $H_2SO_4$:$H_3PO_3$=1:1 was heated at 250° C., the GaN substrate was immersed therein for about 30 minutes, and an etch pit density was measured using an optical microscope. The etch pits in the central portion of the GaN substrate were in a high density in the vicinity of the core, and were in a low density at a region away from the core. In a region with a radius of 50 μm from the core as its center, the etch pit density was not less than $1\times10^7$ $cm^{-2}$. In a region with a radius of 400 μm therefrom excluding the region with a radius of 50 μm from the core as its center, the etch pit density was $3\times10^5$ $cm^{-2}$. A similar distribution of etch pit densities was also obtained in GaN substrates produced in the same manner as in samples 3, 5, and 6, i.e., the etch pit density was not less than $1\times10^6$ $cm^{-2}$ in a region with a radius of 50 μm from the core as its center, whereas the etch pit density was less than $1\times10^6$ $cm^{-2}$.

<Evaluation on Oxygen Concentration>

An oxygen concentration distribution in a GaN substrate produced under the same conditions as those in sample 2 was evaluated using secondary ion mass spectroscopy (SIMS). The oxygen concentration was $2\times10^{18}$ $cm^{-3}$ in the facet growth region in the vicinity of the core, and the oxygen concentration was $3\times10^{16}$ $cm^{-3}$ in the C plane growth region distant from the core (intersection of diagonal lines of 800 μm□ through cores at four corners). Also, in a GaN substrate produced in the same manner as in samples 3, 5, and 6, the oxygen concentration was not less than $5\times10^{17}$ $cm^{-3}$ in the facet growth region in the vicinity of the core and the oxygen concentration was less than $5\times10^{17}$ $cm^{-3}$ in the C plane growth region distant from the core.

<Micro-PL Mapping Measurement>

Micro-PL mapping measurement was performed for each of the GaN substrates of samples 1 and 3 to 8 with the same method and the same conditions as those for the GaN substrate of sample 2. From the results of the micro-PL mapping measurement for the GaN substrates of samples 1 to 8, Ibe1a, Ideep1a, Ibe2a, Ideep2a, Ibe1a/Ibe2a, (Ideep/Ibe)1a, and (Ideep/Ibe)2a were calculated for each of the GaN substrates of samples 1 to 8. Results thereof are shown in Table 1.

<Evaluation on Epitaxial Growth>

MOVPE was employed to form a SBD structure through epitaxial growth on each of the GaN substrates of samples 1 to 8 produced as described above. For the SBD structure, an n+ GaN layer and an n− GaN layer were grown epitaxially in this order. The n+ GaN layer served as a carrier stop layer, had a carrier concentration of $2\times10^{18}$ $cm^{-3}$, and had a thickness of 0.5 μm. The n− GaN layer served as a carrier drift layer, had a carrier concentration of $1\times10^{16}$ $cm^{-3}$, and had a thickness of 5 μm. Epitaxial growth conditions for these layers were as follows: a growth temperature was 1050° C.; TMG (trimethylgallium) and $NH_3$ gas were used as source materials of GaN; and $SiH_4$ gas was used as a source material of Si dopant. Then, an external appearance of the surface of each of the GaN substrates of samples 1 to 8 after the epitaxial growth was observed.

As a result, the GaN substrates of samples 1 to 7 were not cracked and not broken and had excellent external appearances. However, the GaN substrate of sample 8 was broken into pieces. The GaN substrate of sample 8 was broken presumably due to stress during the growth of the GaN layer and a cooling process after the growth.

<Evaluation on SBD Breakdown Voltage>

As an insulating film for field plate, which is a termination structure, a $SiN_x$ layer was formed on a surface of the drift layer in each of the SBD structures grown on the GaN substrates of samples 1 to 8 in the evaluation on epitaxial growth. The $SiN_x$ layer having a thickness of 0.5 μm was formed through plasma CVD (Chemical Vapor Deposition) using $SiH_4$ gas and $NH_3$ gas as source materials.

Then, a RTA (Rapid Thermal Annealing) device was used to treat each of the GaN substrates of samples 1 to 8 having the $SiN_x$ layers formed thereon, for 3 minutes at 600° C. in a $N_2$ gas atmosphere.

Next, a resist was formed on the surface of the $SiN_x$ layer, and openings were then formed in the resist by photolithography. The $SiN_x$ layer exposed through the openings was removed by etching with buffered hydrofluoric acid. In this way, field plate openings was formed. The field plate openings were formed, in the form of squares having sides each having a length of 0.6 mm, at the central portions of the cores arranged in the form of dots at an interval of 0.8 mm (effective area of Schottky electrode: 0.6 mm□). It should be noted that in order to relax electric field concentrations at electrode corner portions, the corner portions of the field plate openings were rounded (radius of curvature of 0.1 mm).

Next, the resist was removed and then a resist was formed again. Then, openings were formed in the resist by photolithography, thereby forming a Schottky electrode pattern. Then, electron beam (EB) deposition was employed to deposit a Ni layer having a thickness of 50 nm and a Au layer having a thickness of 300 nm in this order. Then, a Schottky electrode was formed through lift-off. A region in which the Schottky electrode overlaps with the $SiN_x$ layer was set to have a length (FP width) of 20 μm.

Then, as an ohmic electrode, an electrode having a three-layer structure with Al layer/Ti layer/Au layer was formed on the entire backside surface of each of the GaN substrates of samples 1 to 9, thereby completing a SBD.

Then, a prober was employed to perform mapping measurement for reverse I-V characteristics of 4×4=16 SBD elements (SBD elements in an square region having sides each having a length of 3.2 mm) including all the measurement regions for the micro-PL mapping. A reverse voltage at a current density of $1\times10^{-3}$ [$A/cm^2$] (3.6 μA) was assumed as a breakdown voltage. Table 1 shows in-plane average value, maximum value, and minimum value of breakdown voltages of samples 1 to 8. It should be noted that Table 2 shows manufacturing conditions for the GaN substrates of samples 1 to 8.

TABLE 1

|  |  | Sample 1 | Sample 2 | Sample 3 | Sample 4 | Sample 5 | Sample 6 | Sample 7 | Sample 8 |
|---|---|---|---|---|---|---|---|---|---|
| Diameter [mm] | | 100 | 100 | 100 | 100 | 100 | 100 | 100 | 100 |
| Crystal Structure | | Facet | Facet | Facet | Facet | Facet | Facet | Facet | Coreless |
| First Region | Ibe1a | $8.1 \times 10^3$ | $1.6 \times 10^4$ | $1.9 \times 10^4$ | $8.4 \times 10^3$ | $4.4 \times 10^4$ | $6.8 \times 10^4$ | $4.2 \times 10^5$ | $8.2 \times 10^3$ |
| | Ideep1a | $1.0 \times 10^4$ | $8.3 \times 10^3$ | $8.9 \times 10^3$ | $8.9 \times 10^3$ | $4.8 \times 10^3$ | $4.0 \times 10^3$ | $7.3 \times 10^3$ | $4.3 \times 10^3$ |
| Second Region | Ibe2a | $7.0 \times 10^2$ | $1.7 \times 10^3$ | $5.0 \times 10^3$ | $7.3 \times 10^2$ | $4.9 \times 10^3$ | $3.3 \times 10^4$ | $2.4 \times 10^4$ | $8.2 \times 10^3$ |
| | Ideep2a | $1.6 \times 10^4$ | $2.0 \times 10^4$ | $1.5 \times 10^4$ | $2.7 \times 10^4$ | $5.0 \times 10^3$ | $4.9 \times 10^3$ | $4.1 \times 10^3$ | $4.3 \times 10^3$ |
| Ratio of Bandedge emission Region Intensities | Ibe1a/Ibe2a | 11.6 | 9.4 | 3.8 | 12 | 9.0 | 2.1 | 1.8 | 1 |
| Spectral Intensity Ratio | (Ideep/Ibe)1a | 1.23 | 0.52 | 0.47 | 1.1 | 0.11 | 0.06 | 0.02 | 0.52 |
| | (Ideep/Ibe)2a | 22.9 | 11.8 | 3.0 | 37 | 1.0 | 0.1 | 0.2 | 0.5 |
| SBD Breakdown Voltage [V] | In-Plane Average Value | 367 | 585 | 627 | 392 | 653 | 682 | 567 | — |
| | Maximum Value | 382 | 614 | 632 | 396 | 667 | 689 | 589 | — |
| | Minimum Value | 344 | 445 | 595 | 328 | 616 | 665 | 402 | — |

TABLE 2

|  | Sample 1 | Sample 2 | Sample 3 | Sample 4 | Sample 5 | Sample 6 | Sample 7 | Sample 8 |
|---|---|---|---|---|---|---|---|---|
| Growth Substrate | GaAs | GaAs | GaAs | GaAs | GaN | GaN | GaN | GaN |
| Oxygen Concentration Control | Not Controlled | Controlled | Controlled | Controlled | Controlled | Controlled | Controlled | Controlled |
| Growth Substrate Temperature | 1000 | 1000 | 1030 | 980 | 1000 | 1030 | 980 | 1100 |
| GaCl Partial Pressure [kPa] | 3.06 | 3.06 | 3.06 | 3.06 | 3.06 | 3.06 | 3.06 | 2.40 |
| $NH_3$ Partial Pressure [kPa] | 6.12 | 6.12 | 6.12 | 6.12 | 6.12 | 6.12 | 7.54 | 2.40 |
| Formation of Low-Temperature Buffer Layer | Formed | Formed | Formed | Formed | Not Formed | Not Formed | Not Formed | Not Formed |

<Analysis>

The following describes a comparison between the SBD breakdown voltages and micro-PL mapping characteristics of the samples in Table 1. It is considered that monocrystallinity and surface characteristic of the GaN crystal are more excellent as the ratio (hereinafter, referred to as "spectral intensity ratio") of the average value of the deep emission intensities to the average value of the band-edge emission intensities, which is often used as an index for crystallinity, is smaller. Hence, a high SBD breakdown voltage can be expected.

Actually, it was found that the in-plane average value of the SBD breakdown voltages tended to be low in the samples in which both or one of the spectral intensity ratio of the first regions and the spectral intensity ratio of the second regions were/was large (samples 1, 2, and 4), whereas in the samples in which the spectral intensity ratios of both the regions were low (samples 3, 5, and 6), the in-plane average value of the SBD breakdown voltages became not less than 600 V, which was excellent.

Each of the GaN substrates of samples 2 to 7 had a smaller spectral intensity ratio than that of the GaN substrate of sample 1 formed under the similar growth conditions, presumably because the oxygen concentration in the crystal growth furnace at the early stage of the crystal growth was controlled to be low, i.e., not more than 100 ppm. It is considered that controlling the oxygen concentration in the crystal growth furnace at the early stage of the crystal growth to be low, i.e., not more than 100 ppm led to improved crystallinity of the GaN crystal at the early stage of the crystal growth. The crystallinity of the GaN crystal thus improved at the early stage of the crystal growth provided an improved spectral intensity ratio, with the result that the SBD breakdown voltage also exhibited tendency of improvement.

However, it was found that in sample 7, even though the spectral intensity ratios of both the regions were small, the SBD breakdown voltage was low, i.e., the SBD breakdown voltages of all the SBD elements were not more than 600 V, which was inadequate. This is presumably because the ratio (Ibe1a/Ibe2a) of the band-edge emission region intensities of the first and second regions was too large.

Based on this presumption, the other samples were checked. As a result, it is considered that in order to obtain at least one SBD element having an excellent SBD breakdown voltage (600 V), it is an essential condition that the ratio of the band-edge emission region intensities is small ((Ibe1a/Ibe2a) 9.4).

The ratio of the band-edge emission region intensities in the GaN substrate having a coreless structure such as sample 8 has a minimum value of however, the GaN substrate of sample 8 is broken disadvantageously during epitaxial growth of another semiconductor layer thereon and therefore cannot be used as a substrate for production of semiconductor devices.

Accordingly, the minimum value of the ratios of the intensities of the band-edge emission regions of the GaN substrates having the facet structures is 2.1, which is obtained in sample 6 (the average value thereof in the facet structures is different by about twice from the average value thereof in the coreless structures).

Thus, it was confirmed that when the ratio (Ibe1a/Ibe2a) of the intensities of the band-edge emission regions is not less than 2.1 and not more than 9.4, a SBD element having an excellent SBD breakdown voltage can be obtained. Also, it was confirmed that not only the condition of the ratio of the band-edge emission region intensities but also the spectral intensity ratio have an influence in obtaining a SBD element having an excellent SBD breakdown voltage.

Specifically, both the GaN substrate of sample 2 and the GaN substrate of sample 3 satisfied such a condition that (Ibe1a/Ibe2a) is not less than 2.1 and not more than 9.4; however, the GaN substrate of sample 3, in which the spectral intensity ratio (Ideep/Ibe)1a of the first regions was 0.47 and the spectral intensity ratio (Ideep/Ibe)2a of the second regions was 3, was more excellent than the GaN substrate of sample 2 in which (Ideep/Ibe)1a was 0.52 and (Ideep/Ibe)2a was 11.8, in terms of all of the in-plane average value, maximum value, and minimum value of the SBD breakdown voltages. Particularly, the maximum value of the SBD breakdown voltages of the GaN substrate of sample 2 was more than 600 V, whereas the in-plane average value of the SBD breakdown voltages of the GaN substrate of sample 3 was more than 600 V.

Further, the GaN substrates of samples 5 and 6 satisfied all the following conditions: (Ibe1a/Ibe2a) was not less than 2.1 and not more than 9.4; (Ideep/Ibe)1a was not more than 0.47; and (Ideep/Ibe)2a was not more than 3. In addition to this, the GaN substrates of samples 5 and 6 satisfied such conditions that (Ideep/Ibe)1a was not more than 0.11 and (Ideep/Ibe)2a was not more than 1. Hence, the SBD breakdown voltages of all the SBD elements were not less than 600 V.

In other words, when (Ideep/Ibe)1 a≤0.11 and (Ideep/Ibe)2a≤1, each of the in-plane average value, maximum value, and minimum value of the SBD breakdown voltages was not less than 600 V. Hence, it was found more preferable that (Ideep/Ibe)1a≤0.11 and (Ideep/Ibe)2a≤1.

Based on the above results, an influence of the micro-PL mapping characteristics over the SBD breakdown voltage will be analyzed. The decrease of the SBD breakdown voltage when the ratio of the band-edge emission region intensities of the GaN substrate is more than 9.4 can be interpreted as follows.

For example, if it is assumed that the donor concentration is $1 \times 10^{16}$ cm$^{-3}$ and all the amount of doped Si enters Ga sites and functions as a donor, the thickness of the depletion layer becomes 5 μm when the reverse voltage applied to the SBD is about 200 V, and the depletion layer is considered to affect the carrier stop layer composed of n+ GaN and the GaN substrate under a reverse bias more than that. That is, when the applied reverse voltage is not less than 200 V, the SBD breakdown voltage is considered to be also affected by the carrier stop layer or the GaN substrate. Because extension of the depletion layer is changed depending on a difference in band-edge emission intensity of the GaN substrate, an electric field intensity distribution is caused and electric field concentrations are caused in some portions, with the result that the SBD breakdown voltage is considered to be decreased.

The influence of the spectral intensity ratio of the GaN substrate can be considered as follows.

When the spectral intensity ratio of the GaN substrate is large, crystal bulk characteristics or surface characteristics of the GaN substrate are considered to be not good, presumably resulting in the following adverse effects (A) to (C).

(A) Epitaxial growth characteristics become deteriorated to decrease the SBD breakdown voltage.

(B) When reverse voltage is applied, the depletion layer extends to the carrier stop layer and the GaN substrate through the carrier drift layer, with the result that the SBD breakdown voltage is decreased due to the influence of the poor crystal bulk characteristics or surface characteristics of the GaN substrate.

(C) Electric field concentrations are caused in some portions as a result of non-uniformity in electric field resulting from non-uniformity within the epitaxial growth layer or the plane of the GaN substrate, with the result that the SBD breakdown voltage is decreased.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

INDUSTRIAL APPLICABILITY

The GaN substrate of each of the embodiments and examples can be used for a semiconductor device such as a SBD.

REFERENCE SIGNS LIST

10: GaN substrate; 11: GaN crystal; 21: growth substrate; 21a: surface; 22: patterning layer; 23: threading dislocation; 24: supporting substrate; 25: bonded substrate; 30: orientation flat.

The invention claimed is:

1. A gallium nitride substrate having a C plane as a surface,
the gallium nitride substrate comprising first regions and second regions having different average values of band-edge emission intensities in micro photoluminescence mapping at 25° C. in a square region located in the C plane and having sides each having a length of 2 mm,
an average value Ibe1a of the band-edge emission intensities of the first regions and an average value Ibe2a of the band-edge emission intensities of the second regions satisfying the following relational expressions (I) and (II):

$$Ibe1a > Ibe2a \quad \text{(I) and}$$

$$2.1 \leq Ibe1a/Ibe2a \leq 9.4 \quad \text{(II).}$$

2. The gallium nitride substrate according to claim 1, wherein
a ratio (Ideep/Ibe)1a of the average value of the deep emission intensities of the first regions to the average value of the band-edge emission intensities of the first regions in the micro photoluminescence mapping satisfies a relational expression (III) of (Ideep/Ibe)1a≤ 0.47 . . . (III), and
a ratio (Ideep/Ibe)2a of the average value of the deep emission intensities of the second regions to the average value of the band-edge emission intensities of the second regions in the micro photoluminescence mapping satisfies a relational expression (IV) of (Ideep/Ibe) 2a≤3 . . . (IV).

3. The gallium nitride substrate according to claim 1, wherein
a ratio (Ideep/Ibe)1a of the average value of the deep emission intensities of the first regions to the average value of the band-edge emission intensities of the first regions in the micro photoluminescence mapping satisfies a relational expression (V) of (Ideep/Ibe)1a≤ 0.11 . . . (V), and
a ratio (Ideep/Ibe)2a of the average value of the deep emission intensities of the second regions to the average value of the band-edge emission intensities of the second regions in the micro photoluminescence mapping satisfies a relational expression (VI) of (Ideep/Ibe) 2a≤1 ... (VI).

4. The gallium nitride substrate according to claim 1, wherein each of the first regions has an oxygen concentration of not less than $5 \times 10^{17}$ cm$^{-3}$, and each of the second regions has an oxygen concentration of less than $5 \times 10^{17}$ cm$^{-3}$.

5. The gallium nitride substrate according to claim 1, wherein each of the first regions has a threading dislocation density of not less than $1 \times 10^6$ cm$^2$.

6. A bonded substrate in which the gallium nitride substrate recited in claim 1 is bonded to a supporting substrate.

7. The gallium nitride substrate according to claim 1, wherein the band end emission intensity is the largest one of PL emission intensities at peaks corresponding to the band-edge emission having a peak in a wavelength of about 365 nm, each first region represents a region located in the 2 mm☐ region and having a band-edge emission intensity equal to or more than ½ of the maximum band-edge emission intensity among the band-edge emission intensities, and each second region represents a region located in the 2 mm☐ region and having a band-edge emission intensity less than ½ of the maximum band-edge emission intensity.

8. The gallium nitride substrate according to claim 2, wherein the band end emission intensity is the largest one of PL emission intensities at peaks corresponding to the band-edge emission having a peak in a wavelength of about 365 nm, the deep emission intensity is the largest one of PL emission intensities at peaks corresponding to the deep emission having a peak in a wavelength falling within the range of 450 nm to 600 nm, each first region represents a region located in the 2 mm☐ region and having a band-edge emission intensity equal to or more than ½ of the maximum band-edge emission intensity among the band-edge emission intensities, and each second region represents a region located in the 2 mm☐ region and having a band-edge emission intensity less than ½ of the maximum band-edge emission intensity.

9. The gallium nitride substrate according to claim 3, wherein the band end emission intensity is the largest one of PL emission intensities at peaks corresponding to the band-edge emission having a peak in a wavelength of about 365 nm, the deep emission intensity is the largest one of PL emission intensities at peaks corresponding to the deep emission having a peak in a wavelength falling within the range of 450 nm to 600 nm, each first region represents a region located in the 2 mm☐ region and having a band-edge emission intensity equal to or more than ½ of the maximum band-edge emission intensity among the band-edge emission intensities, and each second region represents a region located in the 2 mm☐ region and having a band-edge emission intensity less than ½ of the maximum band-edge emission intensity.

* * * * *